United States Patent [19]
Cho

[11] Patent Number: 6,049,633
[45] Date of Patent: Apr. 11, 2000

[54] ADAPTIVE ARITHMETIC CODEC METHOD AND APPARATUS

[75] Inventor: Sung-Ryul Cho, Seoul, Rep. of Korea

[73] Assignee: Daewoo Electronics Co., Ltd., Seoul, Rep. of Korea

[21] Appl. No.: 09/209,276

[22] Filed: Dec. 11, 1998

[30] Foreign Application Priority Data

Mar. 26, 1998 [KR] Rep. of Korea ............... 98-10508

[51] Int. Cl.[7] ........................................ G06K 9/36
[52] U.S. Cl. ................. 382/247; 382/239; 382/346; 341/51
[58] Field of Search ............... 382/247, 248, 382/246, 245, 239, 244; 341/51, 107, 50, 52, 59, 63, 67, 102, 103

[56] References Cited

U.S. PATENT DOCUMENTS

| | | | |
|---|---|---|---|
| 4,618,846 | 10/1986 | Ross et al. | 340/347 |
| 5,045,852 | 9/1991 | Mitchell et al. | 341/51 |
| 5,058,144 | 10/1991 | Fiala et al. | 375/122 |
| 5,471,207 | 11/1995 | Zandi et al. | 341/107 |
| 5,577,132 | 11/1996 | Yokose et al. | 382/238 |
| 5,650,783 | 7/1997 | Murashita et al. | 341/107 |
| 5,694,128 | 12/1997 | Kim | 341/79 |
| 5,717,394 | 2/1998 | Schwartz et al. | 341/51 |
| 5,808,572 | 9/1998 | Yang et al. | 341/107 |

FOREIGN PATENT DOCUMENTS 2317794  1/1998  United Kingdom.

*Primary Examiner*—Christopher S. Kelley
*Assistant Examiner*—Kanji Patel
*Attorney, Agent, or Firm*—Pennie & Edmonds LLP

[57] ABSTRACT

A method and apparatus, for arithmetically encoding input data, initialize a codeword table with K codewords, K being an integer greater than 1 and a probability value being assigned to each codeword. First to Mth symbols are extracted from the input data and M codewords are generated based thereon, with M being an integer representing a maximum length of codewords to be registered. First L symbols of the extracted M symbols are allocated with a probability of a longest registered codeword, wherein the longest registered codeword is the same as the first L symbols and L is an integer greater than 1. Then, the generated codewords except for the registered codewords are registered at the codeword table and probability values are reassigned to the registered codewords. After registering a predetermined number of codewords, the remaining symbols are sequentially allocated with the probability values of the corresponding registered codewords. A decoding method and apparatus perform the above steps reversely in order to decode the encoded data.

7 Claims, 4 Drawing Sheets

ADAPTIVE ARITHMETIC CODEC METHOD AND APPARATUS

FIELD OF THE INVENTION

The present invention relates to an adaptive arithmetic codec method and apparatus; and, more particularly, to an adaptive arithmetic codec method and apparatus capable of processing a group of symbols in input data at a time by using a probability distribution.

DESCRIPTION OF THE PRIOR ART

Arithmetic coding is one of variable length coding methods that approaches an entropy limit which represents an average code length per symbol in an ideal coding scheme. In the arithmetic coding method, input symbols are ordered in a probability interval from 0 to 1 in a sequence that is known to both an encoder and a decoder.

An objective of the arithmetic coding is to create a code stream that is a binary fraction pointing to an interval corresponding to an input symbol being coded. Coding a multiplicity of symbols is a process of subdividing the probability interval into smaller and smaller subintervals, subdividing always in proportion to the probability of a particular symbol. As long as the code stream is not allowed to point outside the subinterval assigned to a corresponding symbol, the decoder will recover the original input symbols.

As the subdivision process goes on, the length of a subinterval gets smaller and a highly degree of precision is needed for the subinterval length (generally referred to as "$\underline{A}$") and the current position which the code stream points at (generally referred to as "$\underline{C}$"). Therefore, each time $\underline{A}$ drops below a convenient minimum value, an interval resealing or a renormalization of $\underline{A}$ and $\underline{C}$ is performed.

However, the conventional arithmetic coding scheme has a speed limit when it is applied to a real-time data processing system since each symbol in input data is coded one by one. Thus, it is required to develop an adaptive arithmetic coding scheme capable of processing a group of symbols at a time.

SUMMARY OF THE INVENTION

It is, therefore, a primary object of the invention to provide an adaptive arithmetic codec method and apparatus capable of processing a plurality of symbols at a time by using a probability distribution.

In accordance with one aspect of the present invention, there is provided a method for arithmetically encoding input data, wherein the input data is a sequence of K types of symbols, K being an integer greater than 1, comprising the steps of: (a) initializing contents of a codeword table with K codewords, wherein each codeword corresponds to one of the K types of symbols and a count value for said each codeword is set to 1; (b) extracting 1st to Mth symbols from the input data, M being a predetermined positive integer representing a maximum length of codewords to be registered at the codeword table; (c) assigning a probability value to each codeword based on the count values, wherein the sum of the assigned probability values is 1; (d) generating M codewords based on the extracted M symbols; (e) classifying a generated codeword into a registered group if the generated codeword is already registered at the codeword table; and classifying a generated codeword into an unregistered group if otherwise; (f) allocating a probability value of a longest codeword to a group of symbols consisting of first L symbols of the extracted M symbols and increasing the count value for the longest codeword by 1, wherein the longest codeword is a longest codeword among the codewords in the registered group and consists of L symbols, with L being an integer greater than 1; (g) registering each codeword in the unregistered group at the codeword table, with a count value for said each codeword being set to 1, extracting (L+1)st to (L+M)th symbols from the input data, and repeating the steps (c) to (f), if the number of registered codewords is smaller than P, wherein P is a maximum number of codewords to be registered at the codeword table, and greater than or equal to K; (h) extracting (L+1)st to (L+M)th symbols from the input data and repeating the steps (d) to (f), if the number of registered codewords is greater than or equal to P; and (i) transmitting the probability value allocated to the group of symbols at the step (f) if a predetermined number of symbols have been processed.

In accordance with another aspect of the present invention, there is provided an apparatus for arithmetically encoding input data, wherein the input data is a sequence of K types of symbols, with K being an integer greater than 1, comprising: a block for storing input data; a codeword table for registering codewords and corresponding count values; a block for checking if a group of symbols is registered at the codeword table; and a block for encoding the group of symbols based on the checked result.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

In a conventional encoder employing the binary arithmetic coding method, a multi-valued input symbol is converted into a sequence of binary symbols and then each binary symbol is encoded by using binary arithmetic coding. A binary arithmetic coding method is adopted by a standard image processing scheme such as JPEG (Joint Photographic Experts Group). The binary arithmetic coding method is chosen for an efficient implementation. For example, using the binary symbols allows one to make simple implementation of the interval resealing that eliminates a need for a multiplication. For the sake of convenience, input data of the present invention is assumed to have binary symbols.

Since the present invention processes a group of symbols at a time, the number of codewords and a maximum length of the codewords to be registered must be inputted. If the number of codewords is 8 and the maximum length of the codewords is 3, 2 codewords containing 1 symbol are initially registered, 4 codewords containing 2 symbols and 2 codewords containing 3 symbols are registered in an order that each codeword emerges in encoded symbols of the input data until 8 number of codewords are registered. If the number of codeword is 8 and the maximum length of the codewords is not specified, 2 codewords containing 1 symbol are initially registered and newly emerging codeword of arbitrary length is registered in emergence order until 8 number of codewords are registered.

Figure 1:
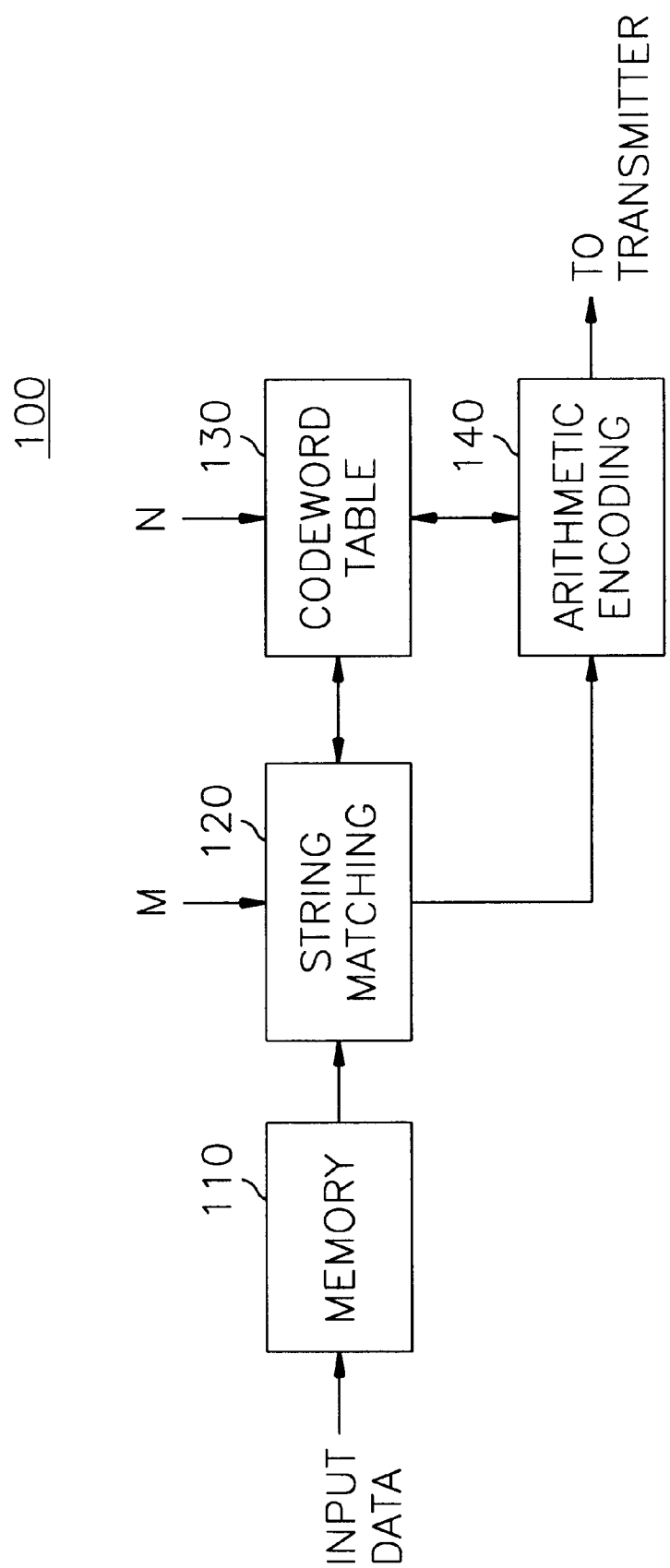
FIG. 1 shows a block diagram of an adaptive arithmetic encoder in accordance with the present invention.

Referring to FIG. 1, a block diagram of an adaptive arithmetic encoder 100 in accordance with the present invention is illustrated, wherein the adaptive arithmetic encoder 100 comprises a memory 110, a string matching block 120, a codeword table 130 and an arithmetic encoding block 140.

In accordance with a preferred embodiment of the present invention, input data comprises binary symbols, e.g., "0 1 0 1 1 1 0 0 0 1 . . . ", the number N of codewords to be registered is 5 and the maximum length M of the codewords is 2.

The input data comprising binary symbols is applied to the memory 110 and stored thereat, N is applied to the codeword table 130 and M is applied to the string matching block 120. The string matching block 120 extracts first M symbols, i.e., a first symbol "0" and a second symbol "1" of the input data from the memory 110 and looks up the codeword table 130 if a codeword "0" corresponding to the first symbol "0" or a codeword "01" corresponding to the first and second symbols "01" is registered thereat. The codeword table 130 is initialized as follows:

contents of the codeword table 130 (initialized)

| codeword | count |
| --- | --- |
| 0 | 1 |
| 1 | 1 | wherein codewords which have been initially registered in the codeword table 130 are "0" and "1"; and their count values are respectively set to 1.

Since the codeword "0" is registered at the codeword table 130 and the codeword "01" is not, the string matching block 120 provides the first symbol "0" to the arithmetic encoding block 140. The arithmetic encoding block 140 encodes the first symbol "0" by using a probability distribution of the codeword table 130, wherein the probability for the codeword "0" to emerge at the first symbol of the input data is ½ and the probability for the codeword "1" to emerge at the first symbol of the input data is ½.

Figure 2A:
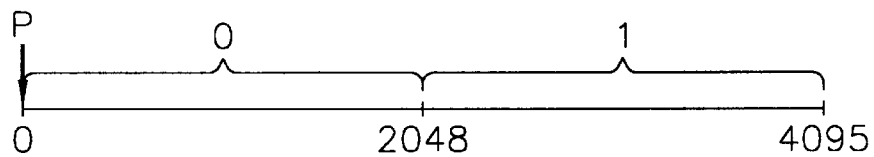
FIGS. 2A to 2D illustrate a binary encoding process by using a probability distribution.

FIG. 2A illustrates an initial probability distribution with reference to the codeword table 130 when the input data is encoded in the unit of 12-bit (4095). The probability interval between 0 and 2048=(4095×½) is assigned to the codeword "0" and the probability interval between 2048 and 4095 is assigned to the codeword "1". A pointer P indicating the encoded value of the input data is located at 0, with 0 representing the probability interval between 0 and 2048.

Thereafter, the count value of the codeword "0" in the codeword table 130 is increased by 1 since the first symbol "0" is encoded by using the codeword "0". Then, it is checked whether every codeword whose length is smaller than or equal to 2 and is contained in the symbols which have been encoded up to then is registered at the codeword table 130. Since only one symbol "0" has been encoded up to then and the codewords "0" and "1" are already registered at the codeword table 130, any new codeword is not registered at the codeword table 130. As a result, the contents of the codeword table 130 becomes as follows:

contents of the codeword table 130 (first undated)

| codeword | count |
| --- | --- |
| 0 | 2 |
| 1 | 1 |

The string matching block 120 extracts a third symbol "0" of the input data from the memory 110 and looks up the codeword table 130 if the codeword "1" corresponding to the second symbol "1" or a codeword "10" corresponding to the second and third symbols "10" is registered thereat.

Since the codeword "1" is registered at the codeword table 130 and the codeword "10" is not, the string matching block 120 provides the second symbol "1" to the arithmetic encoding block 140. The arithmetic encoding block 140 encodes the second symbol "1" by using the probability distribution of the codeword table 130, wherein the probability for the codeword "0" to emerge at the second symbol of the input data is ⅔ and the probability for the codeword "1" to emerge at the second symbol of the input data is ⅓.

Figure 2B:
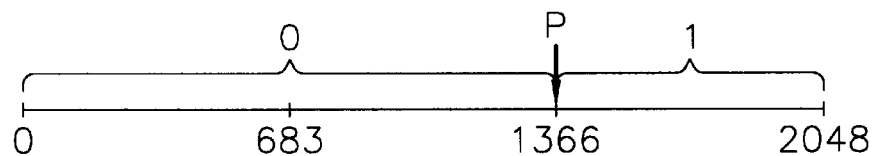

FIG. 2B illustrates a first updated probability distribution with reference to the codeword table 130. The probability interval between 0 and 1366=(2048×⅔) is assigned to the codeword "0" and the probability interval between 1366 and 2048 is assigned to the codeword "1". The pointer P indicating the encoded value of the input data is located at 1366, with 1366 representing the probability interval between 1366 and 2048.

Thereafter, the count value of the codeword "1" in the codeword table 130 is increased by 1 since the second symbol "1" is encoded by using the codeword "1". Then, it is checked whether every codeword whose length is smaller than or equal to 2 and is contained in the symbols which have been encoded up to then is registered at the codeword table 130. Since two symbols "01" have been encoded up to then and only two codewords "0" and "1" are registered at the codeword table 130, the codeword "01" is registered with its count value being 1. As a result, the contents of the codeword table 130 becomes as follows:

contents of the codeword table 130 (second updated)

| codeword | count |
| --- | --- |
| 0 | 2 |
| 1 | 2 |
| 01 | 1 |

The string matching block 120 extracts a fourth symbol "1" of the input data from the memory 110 and looks up the codeword table 130 if the codeword "0" corresponding to the third symbol "0" or the codeword "01" corresponding to the third and fourth symbols "01" is registered thereat.

Since both the codewords "0" and "01" are registered at the codeword table 130, the string matching block 120 provides the third and fourth symbols "01" to the arithmetic encoding block 140. The arithmetic encoding block 140 encodes the third and fourth symbols "01" by using the probability distribution of the codeword table 130, wherein the probability for the codeword "0" to emerge at the third symbol of the input data is ⅖; the probability for the codeword "1" to emerge at the third symbol of the input data is ⅖; and the probability for the codeword "01" to emerge at the third and fourth symbols of the input data is ⅕.

Figure 2C:
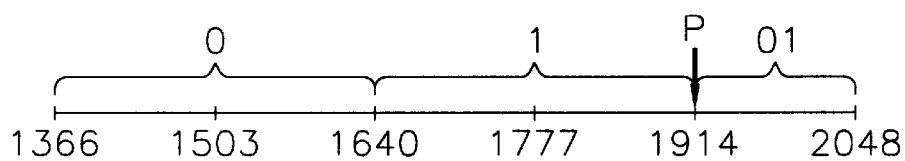

FIG. 2C illustrates a second updated probability distribution with reference to the codeword table 130. The probability interval between 1366 and 1640={1366+(2048−1366)×2/5} is assigned to the codeword "0"; the probability interval between 1640 and 1914={1640+(2048−1366)×2/5) is assigned to the codeword "1"; and the probability interval between 1914 and 2048 is assigned to the codeword "01". The pointer P indicating the encoded value of the input data is located at 1914, with 1914 representing the probability interval between 1914 and 2048.

Thereafter, the count value of the codeword "01" in the codeword table 130 is increased by 1 since the third and fourth symbols "01" is encoded by using the codeword "01". Then, it is checked whether every codeword whose length is smaller than or equal to 2 and is contained in the symbols which have been encoded up to then is registered at the codeword table 130. Since four symbols "0101" have been encoded up to then and three codewords "0", "1" and "01" are registered at the codeword table 130, the codeword "10" is registered with its count value being 1. As a result, the contents of the codeword table 130 becomes as follows:

contents of the codeword table 130 (third updated)

| codeword | count |
|---|---|
| 0 | 2 |
| 1 | 2 |
| 01 | 2 |
| 10 | 1 |

The string matching block 120 extracts next M symbols, i.e. a fifth symbol "1" and a sixth symbol "1" of the input data from the memory 110 and looks up the codeword table 130 if the codeword "1" corresponding to the fifth symbol "1" or a codeword "11" corresponding to the fifth and sixth symbols "11" is registered thereat.

Since the codeword "1" is registered at the codeword table 130 and the codeword "11" is not, the string matching block 120 provides the fifth symbol "1" to the arithmetic encoding block 140. The arithmetic encoding block 140 encodes the fifth symbol "1" by using the probability distribution of the codeword table 130, wherein the probability for the codeword "0" to emerge at the fifth symbol of the input data is 2/7; the probability for the codeword "1" to emerge at the fifth symbol of the input data is 2/7; the probability for the codeword "01" to emerge at the fifth and sixth symbols of the input data is 2/7; and the probability for the codeword "10" to emerge at the fifth and sixth symbols of the input data is 1/7.

Figure 2D:
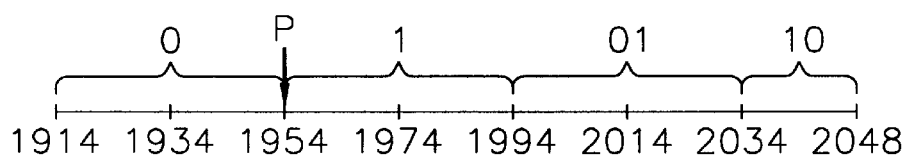

FIG. 2D illustrates a third updated probability distribution with reference to the codeword table 130. The probability interval between 1914 and 1954={1914+(2048−1914)×2/7} is assigned to the codeword "0"; the probability interval between 1954 and 1994={1954+(2048−1914)×2/7} is assigned to the codeword "1"; the probability interval between 1994 and 2034={1994+(2034−1994)×1/7} is assigned to the codeword "01"; and the probability interval between 2034 and 2048 is assigned to the codeword "10". The pointer P indicating the encoded value of the input data is located at 1954, with 1954 representing the probability interval between 1954 and 2048.

Thereafter, the count value of the codeword "1" in the codeword table 130 is increased by 1 since the fifth symbol "1" is encoded by using the codeword "1". Then, it is checked whether every codeword whose length is smaller than or equal to 2 and is contained in the symbols which have been encoded up to then is registered at the codeword table 130. Since five symbols "01011" have been encoded up to then and four codewords "0", "1", "01" and "10" are registered at the codeword table 130, the codeword "11" is registered with its count value being 1. As a result, the contents of the codeword table 130 becomes as follows:

contents of the codeword table 130 (fourth updated)

| codeword | count |
|---|---|
| 0 | 2 |
| 1 | 3 |
| 01 | 2 |
| 10 | 1 |
| 11 | 1 |

Now that N number of codewords, i.e., 5 codewords are registered, the codeword table is not further updated. Hereinafter, the input data is encoded by using the registered codewords only. The encoded data indicated by the pointer P is transmitted to an adaptive arithmetic decoder 300 shown in FIG. 3 through a transmitter(not shown).

Figure 3:
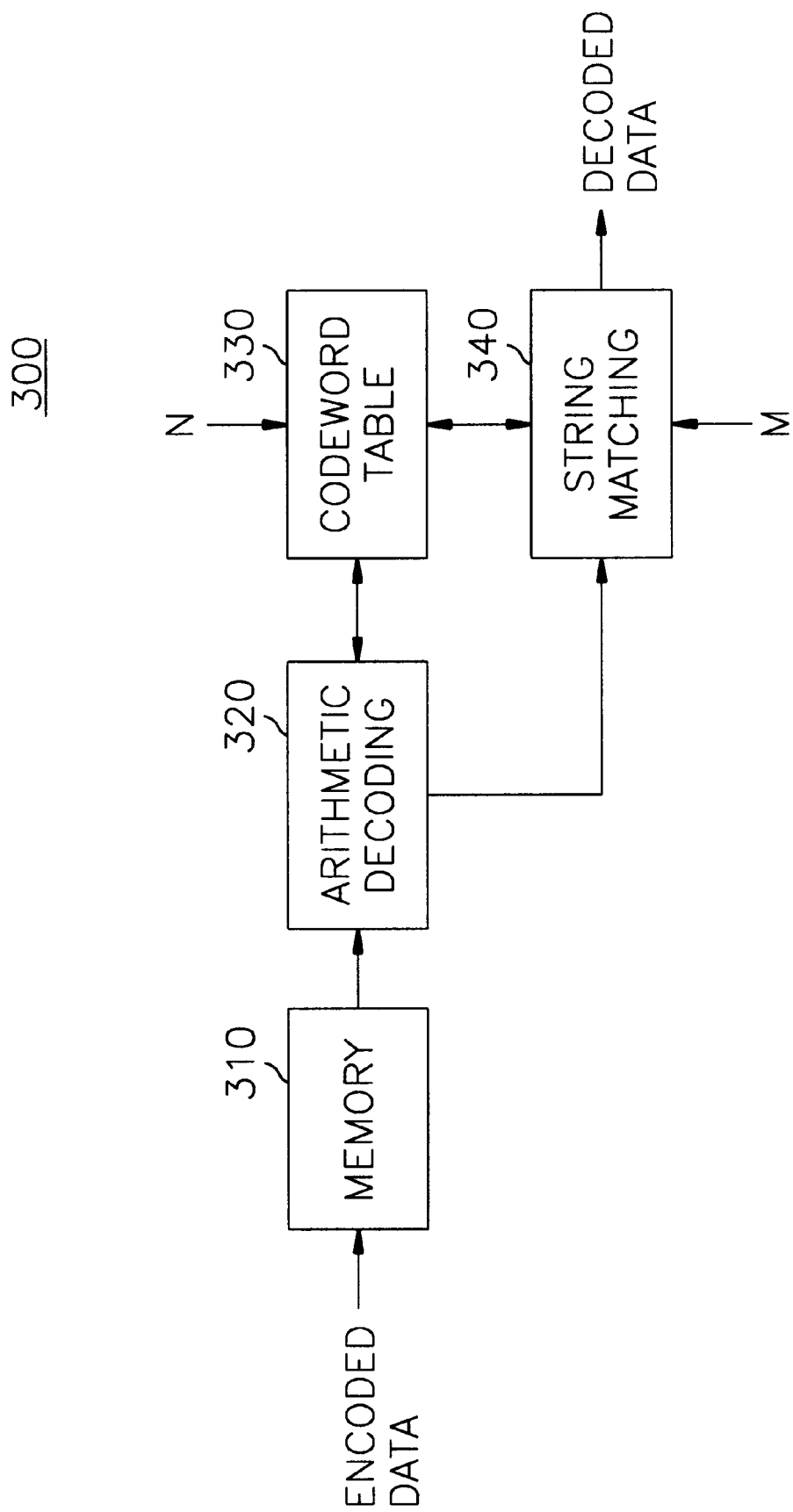
FIG. 3 provides a block diagram of an adaptive arithmetic decoder in accordance with the present invention.

Referring to FIG. 3, a block diagram of an adaptive arithmetic decoder 300 in accordance with the present invention is provided, wherein the adaptive arithmetic decoder 300 comprises a memory 310, an arithmetic decoding block 320, a codeword table 330 and a string matching block 340.

In accordance with a preferred embodiment of the present invention, encoded data, the number N of registered codewords and the maximum length M of the registered codewords transmitted from the adaptive arithmetic encoder 100 shown in FIG. 1 are respectively 1954, 5 and 2.

The encoded data is applied to the memory 310 and stored thereat, N is applied to the codeword table 330 and M is applied to the string matching block 340. The arithmetic decoding block 320 extracts the encoded data 1954 from the memory 310 and decodes the encoded data 1954 by using the probability distribution of the codeword table 330. The codeword table 330 is initialized as follows:

contents of the codeword table 330 (initialized)

| codeword | count |
|---|---|
| 0 | 1 |
| 1 | 1 | wherein codewords which have been initially registered in the codeword table 330 are "0" and "1"; and their count values are respectively set to 1.

Figure 4A:
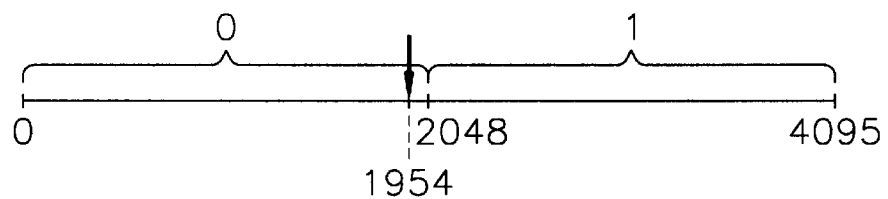
FIGS. 4A to 4D represent a binary decoding process by using a probability distribution.

FIG. 4A illustrates an initial probability distribution with reference to the codeword table 330 when the input data is encoded in the unit of 12-bit (4095). The probability interval between 0 and 2048=(4095×1/2) is assigned to the codeword "0" and the probability interval between 2048 and 4095 is assigned to the codeword "1". Since the encoded data has a value of 1954 that belongs to the probability interval of the codeword "0", a first decoded symbol is determined to be "0" and the first decoded symbol "0" is provided to the string matching block 340.

Thereafter, the count value of the codeword "0" in the codeword table 330 is increased by 1 since the first decoded symbol is determined to be "0". Then, the string matching block 340 checks whether every codeword whose length is smaller than or equal to 2 and is contained in the decoded symbols is registered at the codeword table 330. Since only one symbol "0" has been decoded up to then and the codewords "0" and "1" are already registered at the codeword table 330, new codeword is not registered at the codeword table 330. As a result, the contents of the codeword table 330 becomes as follows:

contents of the codeword table 330 (first updated)

| codeword | count |
|----------|-------|
| 0 | 2 |
| 1 | 1 |

The arithmetic decoding block 320 further decodes the encoded data 1954 from the memory 310 by using the probability distribution of the codeword table 330.

Figure 4B:
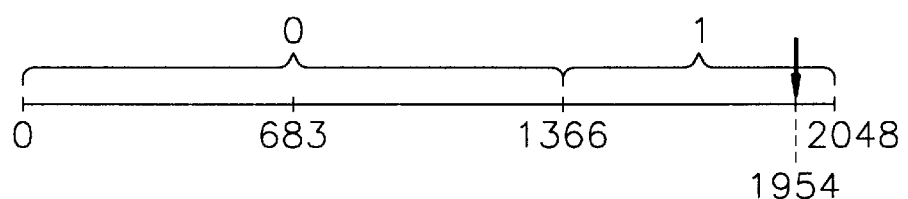

FIG. 4B illustrates a first updated probability distribution with reference to the codeword table 330. The probability interval between 0 and $1366=(2048\times 2/3)$ is assigned to the codeword "0" and the probability interval between 1366 and 2048 is assigned to the codeword "1". Since the encoded data has a value of 1954 that belongs now to the probability interval of the codeword "1", a second decoded symbol is determined to be "1" and the second decoded symbol "1" is provided to the string matching block 340.

Thereafter, the count value of the codeword "1" is increased by 1 since the second decoded symbol is determined to be "1". The string matching block 340 checks whether every codeword whose length is smaller than or equal to 2 and is contained in the decoded symbols is registered at the codeword table 330. Since two symbols "01" have been decoded up to then and only two codewords "0" and "1" are registered at the codeword table 130, the codeword "01" is registered with its count value being 1. As a result, the contents of the codeword table 330 becomes as follows:

contents of the codeword table 330 (second undated)

| codeword | count |
|----------|-------|
| 0 | 2 |
| 1 | 2 |
| 01 | 1 |

The arithmetic decoding block 320 further decodes the encoded data 1954 from the memory 310 by using the probability distribution of the codeword table 330.

Figure 4C:
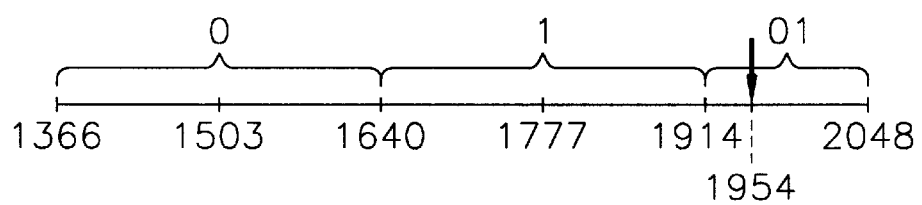

FIG. 4C illustrates a second updated probability distribution with reference to the codeword table 330. The probability interval between 1366 and $1640=\{1366+(2048-1366)\times 2/5\}$ is assigned to the codeword "0"; the probability interval between 1640 and $1914=\{1640+(2048-1366)\times 2/5\}$ is assigned to the codeword "1"; and the probability interval between 1914 and 2048 is assigned to the codeword "01". Since the encoded data has a value of 1954 that belongs now to the probability interval of the codeword "01", a third and fourth decoded symbols are determined to be "01" and the third and fourth decoded symbols "01" are provided to the string matching block 340.

Thereafter, the count value of the codeword "01" is increased by 1 since the third and the fourth decoded symbols are determined to be "01". The string matching block 340 checks whether every codeword whose length is smaller than or equal to 2 and is contained in the decoded symbols is registered at the codeword table 330. Since 4 symbols "0101" have been decoded up to then and only three codewords "0", "1" and "01" are registered at the codeword table 330, the codeword "10" is registered with its count value being 1. As a result, the contents of the codeword table 330 becomes as follows:

contents of the codeword table 130 (third updated)

| codeword | count |
|----------|-------|
| 0 | 2 |
| 1 | 2 |
| 01 | 2 |
| 10 | 1 |

The arithmetic decoding block 320 further decodes the encoded data 1954 from the memory 310 by using the probability distribution of the codeword table 330.

Figure 4D:
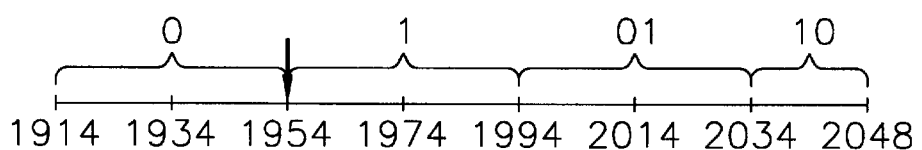

FIG. 4D illustrates a third updated probability distribution with reference to the codeword table 130. The probability interval from 1914 to $1954=\{1914+(2048-1914)\times 2/7\}$ is assigned to the codeword "0"; the probability interval from 1954 to $1994=\{1954+(2048-1914)\times 2/7\}$ is assigned to the codeword "1"; the probability interval from 1994 to $2034=\{1994+(2034-1994)\times 1/7\}$ is assigned to the codeword "01"; and the probability interval from 2034 to 2048 is assigned to the codeword "10". Since the encoded data has a value of 1954 that belongs now to the probability interval of the codeword "1", a fifth decoded symbol is determined to be "1" and the fifth decoded symbol "1" is provided to the string matching block 340.

Thereafter, the count value of the codeword "1" is increased by 1 since the fifth decoded symbol is determined to be "1". The string matching block 340 checks whether every codeword whose length is smaller than or equal to 2 and is contained in the decoded symbols is registered at the codeword table 330. Since 5 symbols "01011" have been decoded up to then and only four codewords "0", "1", "01" and "10" are registered at the codeword table 330, the codeword "11" is registered with its count value being 1. As a result, the contents of the codeword table 330 becomes as follows:

contents of the codeword table 130 (fourth updated)

| codeword | count |
|----------|-------|
| 0 | 2 |
| 1 | 3 |
| 01 | 2 |
| 10 | 1 |
| 11 | 1 |

Now that N number of codewords, i.e., 5 codewords are registered, the codeword table is not further updated. Hereinafter, if there is any room for further decoding, the encoded data is decoded by using the registered codewords only. However, in this case, the decoding process is ended and the string matching block 340 produces the decoded data "01011".

Although the operation of the apparatus of the present invention is illustrated for the specified sequence of binary symbols, it can be adapted to process multi-valued symbols. The multi-valued symbols can be processed with or without being converted into binary symbols. When the multi-valued symbols are processed without being converted into the binary symbols, each symbol in the input data occupies its own probability interval between 0 and 1 in proportion to the probability thereof. The subinterval is subdivided into smaller and smaller subintervals as the input data is further processed. The arithmetic coding method for multi-valued symbols works exactly as stated above, except that an input symbol has multiple values.

In accordance with the present invention, a group of symbols in the input data is processed at a time by using probability distribution of the codeword table and a new codeword is registered at the codeword table by matching symbols in the input data with the registered codewords. Thus, the processing time is substantially reduced since the input data is encoded and decoded not on a symbol-by-symbol basis but on a group-by-group basis.

While the present invention has been described with respect to the particular embodiments, it will be apparent to those skilled in the art that various changes and modifications may be made without departing from the spirit and scope of the invention as defined in the following claims.

What is claimed is:

1. A method for arithmetically encoding input data, wherein the input data is a sequence of K types of symbols, with K being an integer greater than 1, comprising the steps of:

(a) initializing contents of a codeword table with K codewords, wherein each codeword corresponds to one of the K types of symbols and a count value for said each codeword is set to 1;

(b) extracting 1st to Mth symbols from the input data, M being a predetermined positive integer representing a maximum length of codewords to be registered at the codeword table;

(c) assigning a probability value to each codeword based on the count values, wherein the sum of the assigned probability values is 1;

(d) generating M codewords based on the extracted M symbols;

(e) classifying a generated codeword into a registered group if the generated codeword is already registered at the codeword table; and classifying a generated codeword into an unregistered group if otherwise; and (f) allocating a probability value of a longest codeword to a group of symbols consisting of first L symbols of the extracted M symbols and increasing the count value for the longest codeword by 1, wherein the longest codeword is a longest codeword among the codewords in the registered group and consists of L symbols, with L being an integer greater than 1.

2. The method of claim 1 further comprising, after the step (f) the steps of:

(g) registering each codeword in the unregistered group at the codeword table, with a count value for said each codeword being set to 1, extracting (L+1)st to (L+M)th symbols from the input data, and repeating the steps (c) to (f), if the number of registered codewords is smaller than P, wherein P is a maximum number of codewords to be registered at the codeword table, and greater than or equal to K;

(h) extracting (L+1)st to (L+M)th symbols from the input data and repeating the steps (d) to (f), if the number of registered codewords is greater than or equal to P; and (i) transmitting the probability value allocated to the group of symbols at the step (f) if a predetermined number of symbols have been processed.

3. The method of claim 2, wherein the step (c) determines a probability value assigned to a codeword by dividing a count value for the codeword by the sum of all the count values.

4. The method of claim 3, wherein the step (d) generates M codewords each of which consists of 1st to Nth successive symbols, with N being an integer ranging from 1 to M.

5. An apparatus for arithmetically encoding input data, wherein the input data is a sequence of K types of symbols, with K being an integer greater than 1, comprising:

means for storing input data;

a codeword table for registering codewords and corresponding count values, said codeword table being initialized with K codewords, wherein each codeword corresponds to one of the K types of symbols and a count value for said each codeword is set to 1;

means for checking if a group of symbols is registered at the codeword table, said means for checking including:
means for extracting $1^{st}$ to $M^{th}$ symbols from the input data, M being a predetermined positive integer representing a maximum length of codewords to be registered at the codeword table;
means for generating M codewords based on the extracted M symbols;
means for classifying a generated codeword into a registered group if the generated codeword is already registered at the codeword table; and classifying a generated codeword into an unregistered group if otherwise;
means for selecting a longest codeword among the codewords in the registered group and detecting a length L of the longest codeword, with L being an integer greater than or equal to 1; and
means for increasing the count value for the longest codeword by 1; and means for encoding the group of symbols based on the checked result, said means for encoding including:
means for assigning a probability value to each codeword based on the count values, wherein the sum of the assigned probability values is 1;
means for allocating a probability value of the longest codeword to a group of symbols consisting of first L symbols of the extracted M symbols; and
means for transmitting the probability value allocated to the group of symbols, and wherein said means for checking further includes:

means for registering each codeword in the unregistered group at the codeword table, with a count value for said each codeword being set to 1, if the number of registered codewords is smaller than P, wherein P is a maximum number of codewords to be registered at the codeword table, and greater than or equal to K; and means for extracting $(L+1)^{st}$ to $(L+M)^{th}$ symbols from the input data.

6. The apparatus of claim 5, wherein the assigning means determines a probability value assigned to a codeword by dividing a count value for the codeword by the sum of all the count values.

7. The apparatus of claim 6, wherein the generating means generates M codewords each of which consists of 1st to Nth successive symbols, with N being an integer ranging from 1 to M.

* * * * *